United States Patent
Choi et al.

(10) Patent No.: US 8,174,012 B2
(45) Date of Patent: May 8, 2012

(54) ORGANIC LIGHT EMITTING DIODE DISPLAY DEVICE AND METHOD OF MANUFACTURING THE SAME

(75) Inventors: Jong-Hyun Choi, Suwon-si (KR); Kyung-Jin Yoo, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 297 days.

(21) Appl. No.: 11/935,670

(22) Filed: Nov. 6, 2007

(65) Prior Publication Data

US 2008/0111135 A1    May 15, 2008

(30) Foreign Application Priority Data

Nov. 10, 2006   (KR) .................. 10-2006-0111187

(51) Int. Cl.
    *H01L 29/04*    (2006.01)
(52) U.S. Cl. ............. 257/59; 257/E29.137; 257/72; 438/149; 349/139
(58) Field of Classification Search ............. 257/59, 257/72, 347, E29.137, E29.117, E29.147; 349/139; 438/149
    See application file for complete search history.

(56) References Cited

U.S. PATENT DOCUMENTS

| | | | |
|---|---|---|---|
| 6,548,331 B2 * | 4/2003 | Lee et al. ............ | 438/149 |
| 7,456,922 B2 * | 11/2008 | Eguchi ............ | 349/138 |
| 7,518,147 B2 * | 4/2009 | Bae et al. ............ | 257/72 |
| 7,714,391 B2 | 5/2010 | Kim et al. | |
| 2005/0127810 A1 * | 6/2005 | Fukuhara et al. ............ | 313/364 |

FOREIGN PATENT DOCUMENTS

| | | |
|---|---|---|
| JP | 8-330602 | 12/1996 |
| JP | 2001-28338 | 1/2001 |

(Continued)

OTHER PUBLICATIONS

Notice of Allowance issued by Korean Intellectual Property Office in Korean Patent Application No. 2006-11187 on Aug. 27, 2007.
Leung, T.C., C.F. Cheng and M.C. Poon, "Poly Silicon Film Formulation by Nickel-Induced-Lateral-Crystallization and Pulsed Rapid Thermal Annealing" 2001, IEEE, pp. 93-96.

(Continued)

*Primary Examiner* — David Vu
(74) *Attorney, Agent, or Firm* — H.C. Park & Associates, PLC

(57) ABSTRACT

An organic light emitting diode display device (OLED display device) having uniform electrical characteristics and a method of manufacturing the same. The OLED display device includes: a substrate; a semiconductor layer disposed on the substrate, and including source and drain regions and a channel region formed using metal induced lateral crystallization (MILC); a gate insulating layer for electrically insulating the semiconductor layer; a gate electrode disposed on the gate insulating layer; an interlayer insulating layer for electrically insulating the gate electrode; a thin film transistor (TFT) including source and drain electrodes that are electrically connected to the source and drain regions of the semiconductor layer; a first electrode for a capacitor disposed on a region of the substrate to be spaced apart from the TFT and formed using a metal induced crystallization (MIC); the gate insulating layer for electrically insulating the first capacitor electrode; a second electrode for the capacitor disposed on the gate insulating layer; a planarization layer disposed on the TFT and the capacitor; a first electrode disposed on the planarization layer; a pixel defining layer disposed on the first electrode; an organic layer disposed on the first electrode and the pixel defining layer, and including at least an emission layer; and a second electrode disposed on the organic layer.

10 Claims, 17 Drawing Sheets

FOREIGN PATENT DOCUMENTS

| | | |
|---|---|---|
| JP | 2006-54415 | 2/2006 |
| JP | 2006-66860 | 3/2006 |
| KR | 2002-78119 | 10/2002 |
| KR | 2005-73744 | 7/2005 |
| KR | 2005-78392 | 8/2005 |
| KR | 2005-92995 | 9/2005 |

OTHER PUBLICATIONS

Choi et al., "Metal Induced Lateral Crystallization of Amorphous Silicon Through a Silicon Nitride Cap Layer," 2003, Electrochemical and Solid-State Letters, G16-G18.

* cited by examiner

ORGANIC LIGHT EMITTING DIODE DISPLAY DEVICE AND METHOD OF MANUFACTURING THE SAME

CROSS-REFERENCE TO RELATED APPLICATION

This application claims the benefit of Korean Application No. 2006-111187, filed Nov. 10, 2006 in the Korean Intellectual Property Office, the disclosure of which is incorporated herein by reference.

BACKGROUND OF THE INVENTION

1. Field of the Invention

An aspect of the present invention relates to an organic light emitting diode display device (OLED display device) and a method of manufacturing the same and, more particularly, to an OLED display device having uniform electrical characteristics and a method of manufacturing the same.

2. Description of the Related Art

Nowadays, in order to overcome the shortcomings of conventional display devices such as cathode ray tubes (CRTs), much attention is given to flat panel display devices (FPDs), such as liquid crystal displays (LCDs), organic light emitting diode display devices (OLEDs), and plasma display panels (PDPs).

An FPD such as an OLED display device or LCD includes a thin film transistor (TFT), which is used as a switching device or a driving device, and a capacitor, which is connected to the TFT, stores an external signal, and applies the stored external signal in the next signal period.

FIGS. 1A through 1E are cross-sectional views illustrating a process of manufacturing a conventional OLED display device.

Referring to FIG. 1A, a buffer layer 110 is formed on a substrate 100, which is a plastic substrate or a glass substrate. An amorphous silicon (a-Si) layer (not shown) is formed on the buffer layer 110 and then patterned to form a semiconductor layer 120 and a first capacitor electrode 125 for a capacitor. Thereafter, an insulating layer 130 is formed on the substrate 100.

Referring to FIG. 1B, a photoresist pattern 140 is formed on a region of the insulating layer 130 corresponding to the semiconductor layer 120. An ion implantation process is performed using the photoresist pattern 140 as an ion implantation mask, thereby defining source and drain regions and a channel region in the semiconductor layer 120 and implanting impurity ions into the first capacitor electrode 125.

Referring to FIG. 1C, the insulating layer 130 is etched to form an insulating layer pattern on the channel region of the semiconductor layer 120. A crystallization inducing metal layer 150 is formed on the substrate 100 and then removed from a region except the semiconductor layer 120 and the first capacitor electrode 125.

Referring to FIG. 1D, a gate insulating layer 160 is formed on the substrate 100. The substrate 100 is annealed, so that the source and drain regions and the first capacitor electrode 125 are crystallized by a metal induced crystallization (MIC) process, while the channel region is crystallized by a metal induced lateral crystallization (MILC) process.

Referring to FIG. 1E, a gate electrode 170 is formed to correspond to the semiconductor layer 120, and a second capacitor electrode 175 for the capacitor is formed to correspond to the first capacitor electrode 125. Thereafter, an interlayer insulating layer 180 is formed on the substrate 100, and source and drain electrodes 191 and 192 are formed on the interlayer insulating layer 180 to complete a TFT and a capacitor. Although not shown in the drawings, a first electrode, an organic layer, and a second electrode are formed to complete a conventional OLED display device.

However, when the semiconductor layer is crystallized by both the MIC and MILC processes as described above, MILC crystallinities run into each other in the channel region, thus generating an MILC front that is uncrystallized in the channel region. As a result, the mobility of charges is lowered, thus deteriorating the characteristics of the OLED display device.

SUMMARY OF THE INVENTION

An aspect of the present invention provides an organic light emitting diode display device (OLED display device) having uniform electrical characteristics and a method of manufacturing the same.

In an exemplary embodiment of the present invention, an OLED display device includes: a substrate; a semiconductor layer disposed on the substrate, and including source and drain regions and a channel region that are formed using metal induced lateral crystallization (MILC); a gate insulating layer electrically insulating the semiconductor layer; a gate electrode disposed on the gate insulating layer; an interlayer insulating layer electrically insulating the gate electrode; a thin film transistor (TFT) including source and drain electrodes that are electrically connected to the source and drain regions of the semiconductor layer; a first capacitor electrode disposed on a region of the substrate to be spaced apart from the TFT and formed using a metal induced crystallization (MIC); the gate insulating layer electrically insulating the first capacitor electrode; a second capacitor electrode disposed on the gate insulating layer; a planarization layer disposed on the TFT and the capacitor; a first electrode disposed on the planarization layer; a pixel defining layer disposed on the first electrode; an organic layer disposed on the first electrode and the pixel defining layer, and including at least an emission layer; and a second electrode disposed on the organic layer.

In another exemplary embodiment of the present invention, a method of manufacturing an OLED display device includes: providing a substrate; forming an amorphous silicon (a-Si) layer on the substrate; forming an insulating layer on the a-Si layer; etching the insulating layer to expose a region of the a-Si layer; forming a crystallization inducing metal layer on an entire surface of the substrate; annealing the substrate to crystallize the exposed region of the a-Si layer using a metal induced crystallization (MIC) process and to crystallize the remaining region of the a-Si layer using a metal induced lateral crystallization (MILC) process; removing the insulating layer and the crystallization inducing metal layer; patterning the crystallized Si layer to form a first capacitor electrode in an MIC crystallized region and to form a semiconductor layer in an MILC crystallized region; forming a gate insulating layer on the substrate; forming a gate electrode and a second capacitor electrode on the gate insulating layer; forming an interlayer insulating layer on the substrate; forming source and drain electrodes on the interlayer insulating layer; forming a first electrode to be electrically connected to the source or drain electrodes; forming an organic layer on the first electrode; and forming a second electrode on the entire surface of the substrate.

In still another exemplary embodiment of the present invention, an OLED display device includes: a substrate in which a first unit pixel region, a second unit pixel region, and a wiring region between the first unit pixel region and the second unit pixel region are defined; semiconductor layers disposed on the first unit pixel region and the second unit pixel region of the substrate, each semiconductor layer including source and drain regions and a channel region that are obtained using metal induced lateral crystallization (MILC); a gate insulating layer electrically insulating the semiconductor layers; gate electrodes disposed on the gate insulating layer; an interlayer insulating layer electrically insulating the gate electrodes; TFTs, each TFT including source and drain electrodes that are electrically connected to the source and drain regions of the semiconductor layer; first capacitor electrodes symmetrically disposed with respect to the wiring region in respective unit pixels of the substrate, and disposed on the first and second unit pixel regions, and formed using metal induced crystallization (MIC); the gate insulating layer electrically insulating the first capacitor electrodes; second capacitor electrodes disposed on the gate insulating layer; a planarization layer disposed on the TFTs and the capacitors; a first electrode disposed on the planarization layer; a pixel defining layer disposed on the first electrode; an organic layer disposed on the first electrode and the pixel defining layer, the organic layer including at least one emission layer; and a second electrode disposed on the organic layer.

In yet another exemplary embodiment of the present invention, a method of manufacturing an OLED display device includes: providing a substrate in which a first unit pixel region, a second unit pixel region, and a wiring region between the first unit pixel region and the second unit pixel region are defined; forming an a-Si layer on the substrate; forming an insulating layer on the a-Si layer; etching the insulating layer to symmetrically expose regions of the a-Si layer with respect to the wring region; forming a crystallization inducing metal layer on the entire surface of the substrate; annealing the substrate to crystallize the exposed regions of the a-Si layer using an MIC process and to crystallize the remaining region of the a-Si layer using an MILC process; removing the insulating layer and the crystallization inducing metal layer; patterning the crystallized Si layer to form first capacitor electrodes using MIC crystallized regions and to form semiconductor layers using MILC crystallized regions; forming a gate insulating layer on the substrate; forming gate electrodes and second capacitor electrodes on the gate insulating layer; forming an interlayer insulating layer on the substrate; forming source and drain electrodes on the interlayer insulating layer; forming a first electrode to be electrically connected to the source or drain electrodes; forming an organic layer on the first electrode; and forming a second electrode on an entire surface of the substrate.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
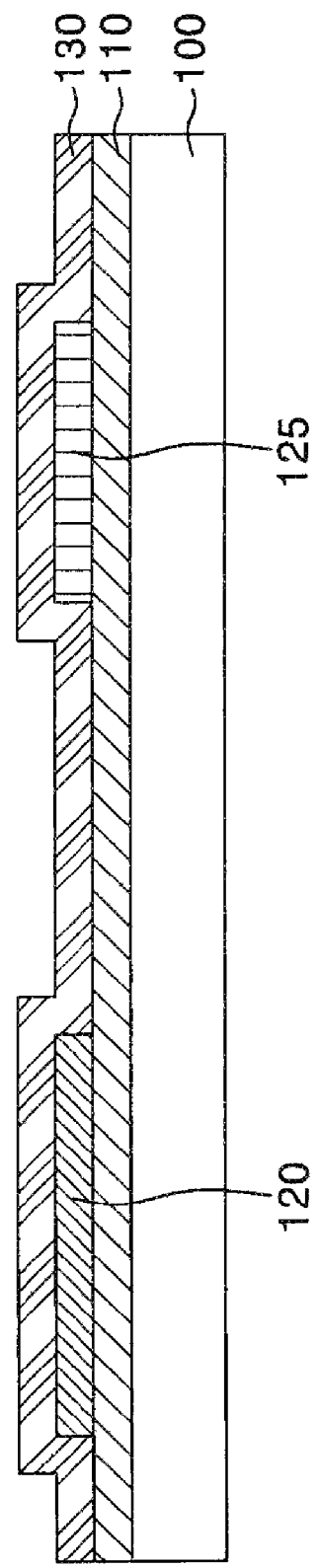
FIGS. 1A through 1E are cross-sectional views illustrating a process of manufacturing a conventional organic light emitting diode display device (OLED display device)
Figure 1B:
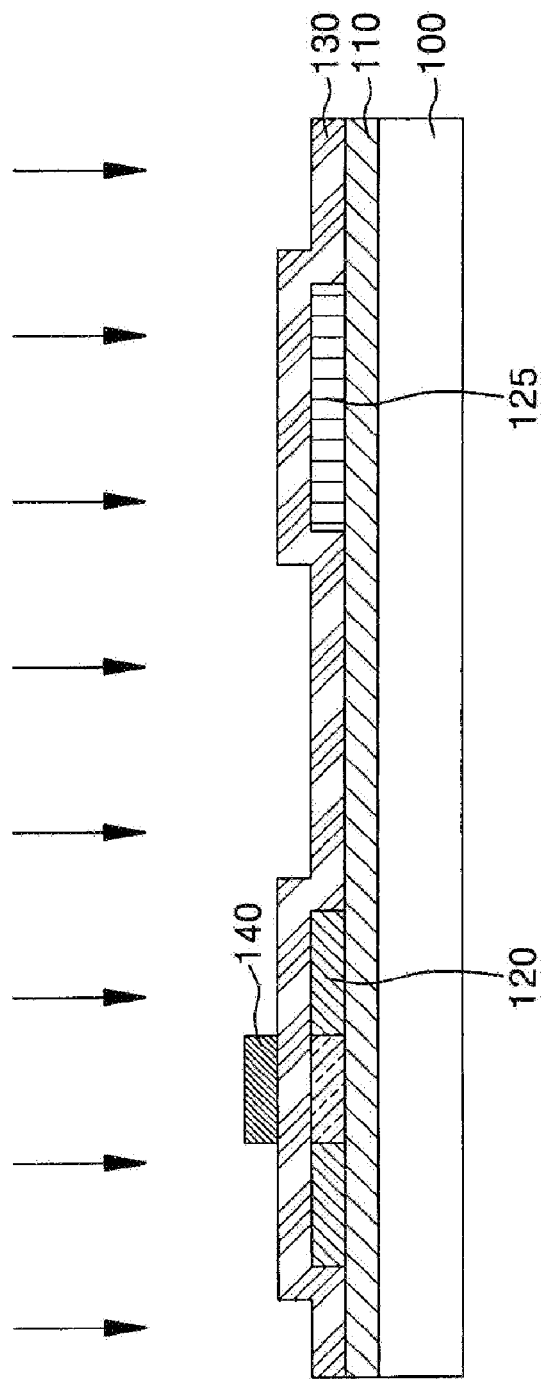
Figure 1C:
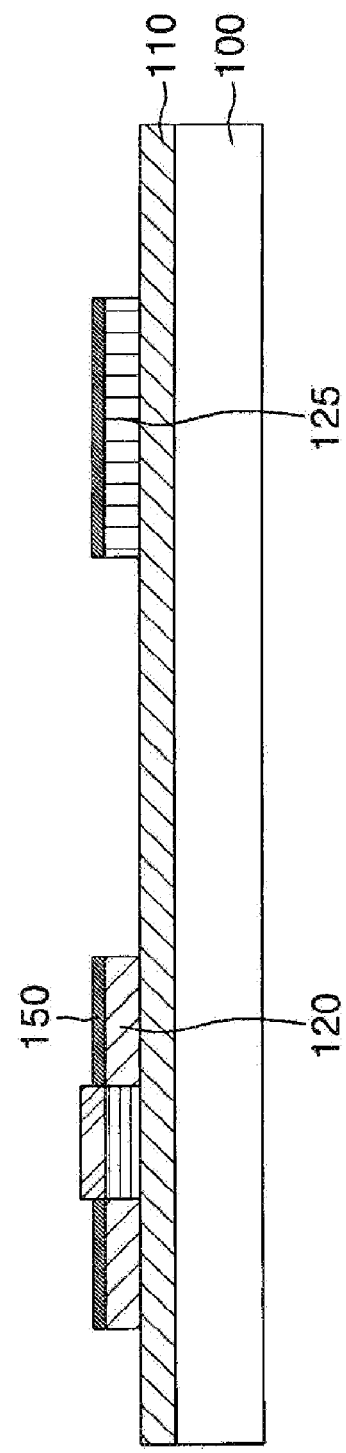
Figure 1D:
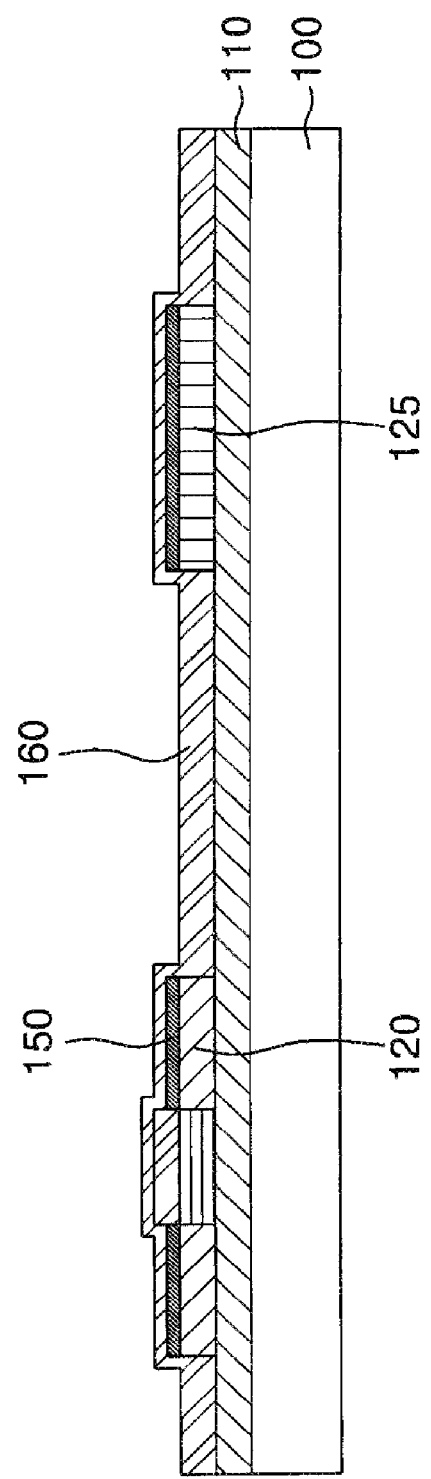
Figure 1E:
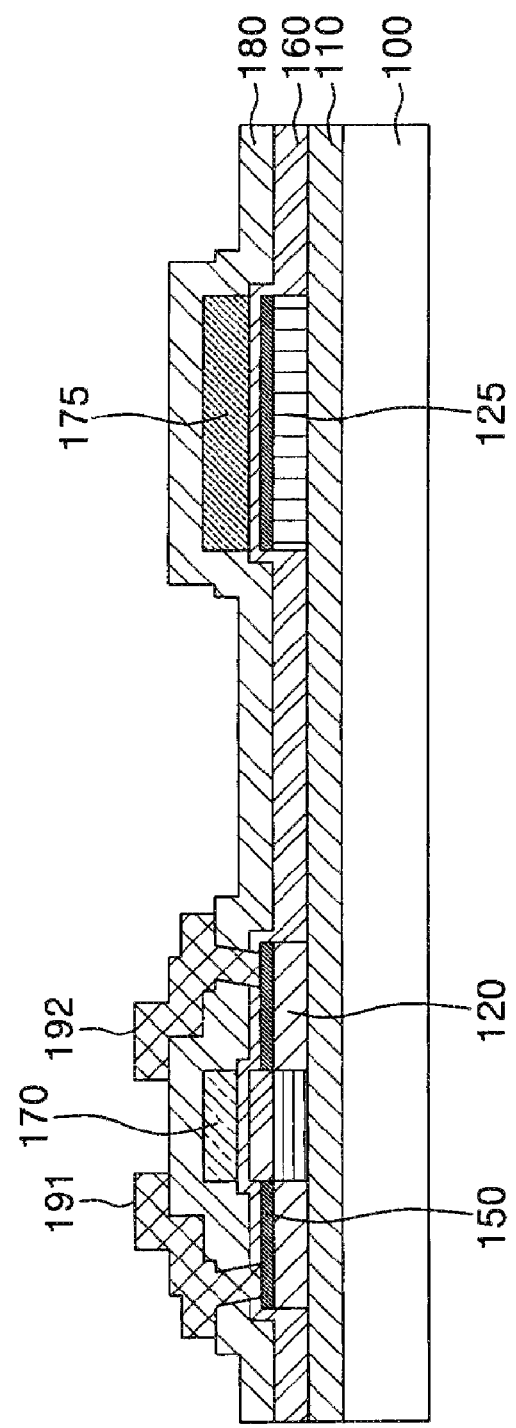

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIGS. 2A through 2H are a plan view and cross-sectional views illustrating a process of manufacturing an OLED display device according to an exemplary embodiment of the present invention.

Figure 2A:
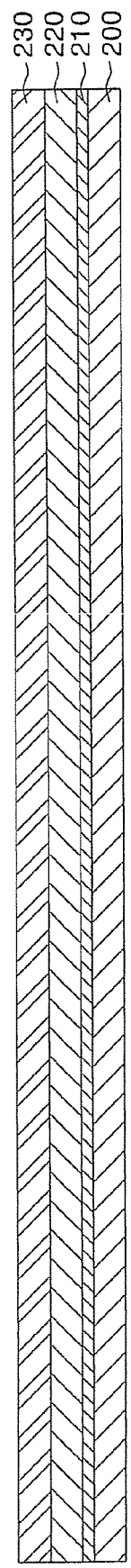
FIGS. 2A through 2H are a plan view and cross-sectional views illustrating a process of manufacturing an OLED display device according to an exemplary embodiment of the present invention.

Referring to FIG. 2A, a substrate 200, for example, a plastic substrate, a conductive substrate, or a transparent glass substrate, is provided. A buffer layer 210 is formed on the substrate 200 in order to protect a device that will be formed on the substrate 200. The buffer layer 210 may be a silicon oxide layer, a silicon nitride layer, or a combination thereof.

Thereafter, an amorphous silicon (a-Si) layer 220 is formed on the entire surface of the substrate 200. The a-Si layer 220 may be formed using a physical vapor deposition (PVD) apparatus or a chemical vapor deposition (CVD) apparatus. The PVD apparatus may be, for example, a sputtering apparatus. The CVD apparatus may be, for example, a plasma-enhanced CVD (PECVD) apparatus or a low pressure CVD (LPCVD) apparatus.

Thereafter, an insulating layer 230 is formed on the entire surface of the substrate 200. The insulating layer 230 may be a silicon oxide layer, a silicon nitride layer, or a combination thereof.

Figure 2B:
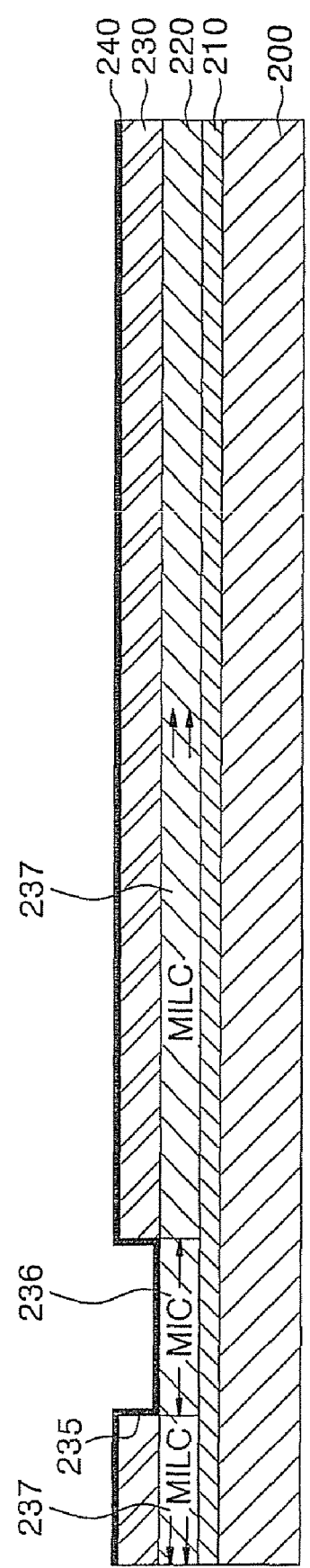

Referring to FIG. 2B, a portion of the insulating layer 230 is etched, thereby forming an opening 235 to expose a region of the a-Si layer 220 where a first capacitor electrode for a capacitor will be formed later.

Subsequently, a crystallization inducing metal layer 240 is formed on an entire surface of the substrate 200. The crystallization inducing metal layer 240 may be formed of one selected from the group consisting of Ni, Pd, Ti, Ag, Au, Al, Sn, Sb, Cu, Co, Mo, Tr, Ru, Rh, Cd, and Pt. Preferably, the crystallization inducing metal layer 240 may be formed of Ni.

In this case, the crystallization inducing metal layer 240 may be formed using one selected from the group consisting of a sputtering apparatus, a heating evaporation apparatus, an ion implantation apparatus, and a CVD apparatus. Preferably, the crystallization inducing metal layer 240 may be formed using a sputtering apparatus.

The crystallization inducing metal layer 240 may be deposited to a thickness of 0.1 to 10000 Å, preferably, 10 to 200 Å.

The crystallization inducing metal layer 240 is also deposited in the opening 235 formed in the insulating layer 230.

Subsequently, the substrate 200 is annealed to crystallize the a-Si layer 220. A region of the a-Si layer 220 that contacts the crystallization inducing metal layer 240 (i.e., a region where the first capacitor electrode will be formed later) may be crystallized by a metal induced crystallization (MIC) process, while the remaining region of the a-Si layer 220 may be crystallized by a metal induced lateral crystallization (MILC) process.

Specifically, the region of the a-Si layer 220 exposed by the opening 235 of the insulating layer 230 (i.e., a region 236 where the first capacitor electrode will be formed later) is crystallized by an MIC process. Also, MIC crystallinities formed during the crystallization of the region 236 diffuse into the remaining region 237 of the a-Si layer 220 so that the region 237 of the a-Si layer 220 is crystallized by an MILC process. Since the region 236 on which the MIC process is performed is wide, a large amount of crystallization inducing metal is used for the MIC process. Thus, the region 237 where the MILC process is performed is also widened so that even each unit pixel region may be crystallized by the MILC process.

Figure 2C:
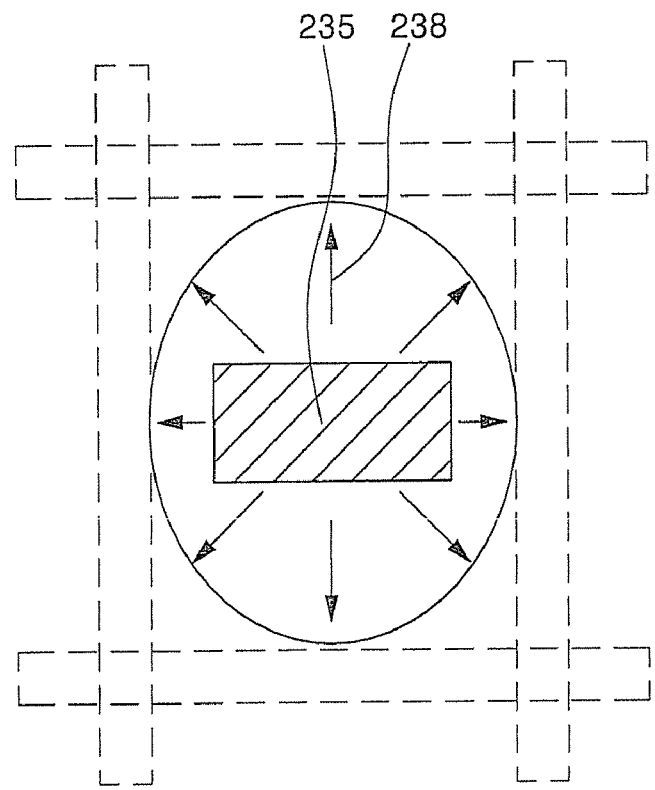

In other words, referring to FIG. 2C, which is a plan view of a unit pixel, MIC and MILC crystallizations are performed through the opening 235 of the unit pixel. In this case, MILC crystallinity (238) of the unit pixel comes across MILC crystallinity of another unit pixel in a region where a metal wiring will be formed later, thus generating an MILC front.

Thus, a uniform MILC crystallized polycrystalline silicon (poly-Si) region without an MILC front can be formed in each unit pixel, and a semiconductor layer can be patterned and used in each unit pixel without any limitation.

In the embodiment of the present invention, it is described that the region where the first capacitor electrode will be formed using the MIC process is located in the center of each unit pixel to perform the MIC and MILC processes. However, the embodiments of the present invention are not limited thereto and the region where the first capacitor electrode will be formed using the MIC process may be located in a different position such that the MILC front is not formed in each unit pixel. In other words, the region where the MIC process is performed is not limited to the embodiment of the present invention.

The MIC process includes crystallizing the a-Si layer 220 due to metal or metal silicide, for example, nickel silicide. The MIC process may be performed at a low temperature of about 100 to 300° C.

The metal silicide used during the MIC process may be obtained by annealing silicon and one selected from the group consisting of Ni, Pd, Ti, Ag, Au, Al, Sn, Sb, Cu, Co, Mo, Tr, Ru, Rh, Cd, and Pt.

In the embodiment of the present invention, the MIC and MILC processes are performed at a temperature of 400 to 700° C., preferably, 500 to 600° C., for several minutes to several tens of minutes so that crystallinities diffuse into each unit pixel.

Figure 2D:
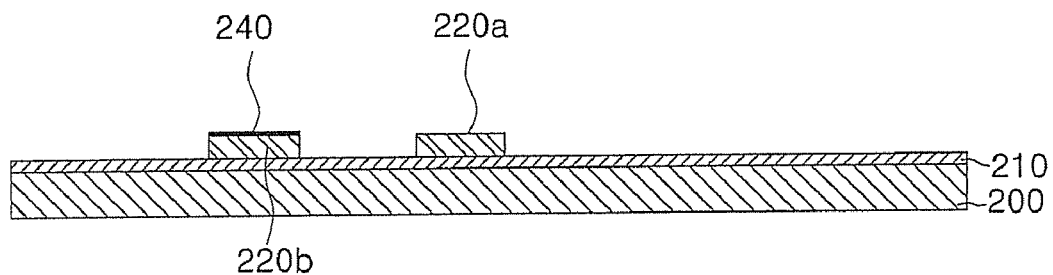

Referring to FIG. 2D, the insulating layer 230 and the crystallization inducing metal layer 240 are removed. The crystallization inducing metal layer 240 is not removed from the poly-Si layer 220 exposed by the opening 235.

Thereafter, the crystallized poly-Si layer 220 is patterned to form a semiconductor layer 220a and a first capacitor electrode 220b for a capacitor.

The first capacitor electrode 220b is formed using a metal silicide region that is crystallized in the previous MIC process. Since a capacitor having electrical characteristics similar to a metal has good characteristics, the metal silicide is not removed and used to form the first capacitor electrode 220b.

Also, the semiconductor layer 220a corresponds to a region that is crystallized in the previous MILC process. The semiconductor layer 220a may be formed such that a lengthwise direction of a channel region of the semiconductor layer 220a is parallel to a crystallization direction of the MILC process. As a result, a channel region without an MILC front can be formed, so that the electrical characteristics of the device can be enhanced without lowering the mobility of charges.

Figure 2E:
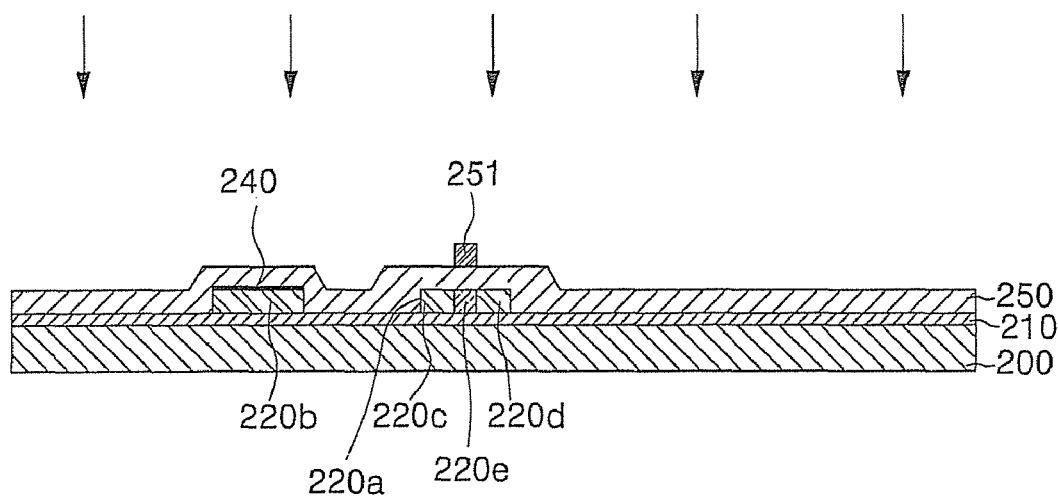

Referring to FIG. 2E, a gate insulating layer 250 is formed on the entire surface of the substrate 200. The gate insulating layer 250 may be a silicon oxide layer, a silicon nitride layer, or a double layer thereof. The gate insulating layer 250 is formed between the first capacitor electrode 220b and a second capacitor electrode for the capacitor, which will be formed later. Thus, the capacitance of the capacitor may be controlled by adjusting the thickness of the gate insulating layer 250. Since the capacitance of the capacitor is inversely proportional to the thickness of the gate insulating layer 250, the gate insulating layer 250 may be formed as thin as possible.

Next, a photoresist is coated on the substrate 200 using, for example, a spin coating process, and a photoresist pattern 251 is formed on a portion of the semiconductor layer 220a using exposure and developing processes. The photoresist pattern 251 may be formed in the center of the semiconductor layer 220a. This is because a region on which the photoresist pattern 251 is formed will be defined as a channel region of the semiconductor layer 220a.

Thereafter, an ion implantation process is performed using the photoresist pattern 251 as an ion implantation mask on the entire surface of the substrate 200 having the photoresist pattern 251. Thus, source and drain regions 220c and 220d and a channel region 220e are defined in the semiconductor layer 220a. The semiconductor layer 220a is divided into the source and drain regions 220c and 220d and the channel region 220e because an impurity doped region is defined as the source and drain regions 220c and 220d and an impurity undoped region is defined as the channel region 220e.

Also, during the ion implantation process, impurity ions are also implanted into the first capacitor electrode 220b. As the electrode of a capacitor becomes more similar in electrical characteristics to a conductor, the characteristics of the capacitor become better. Therefore, by implanting impurity ions into the first capacitor electrode 220b formed of silicon, the first capacitor electrode 220b may be made similar to a conductor.

Figure 2F:
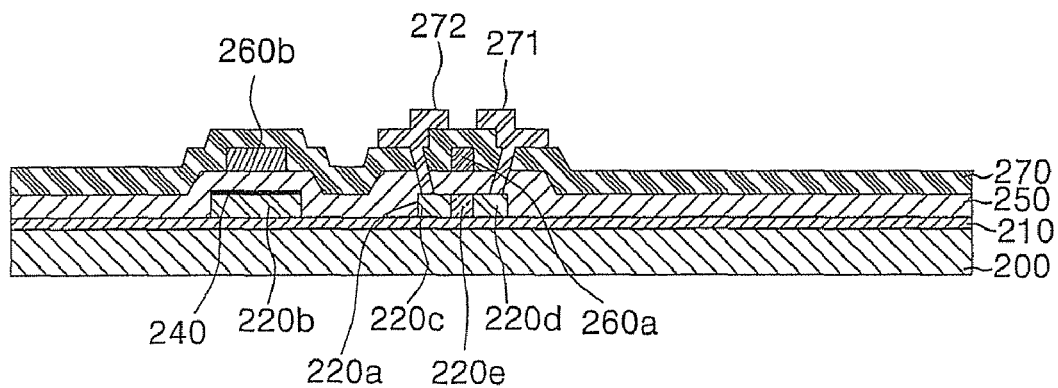

Referring to FIG. 2F, after the ion implantation process is finished, the photoresist pattern 251 is removed. A conductive material for forming both a gate electrode and a second capacitor electrode for the capacitor is deposited on the entire surface of the substrate 200 and then patterned to correspond to a portion of the semiconductor layer 220a and the first capacitor electrode 220b. Thus, a gate electrode 260a and a second capacitor electrode 260b are formed, thereby completing a capacitor. The second capacitor electrode 260b may be formed of the same material as the gate electrode 260a or of the same material as the source and drain electrodes that will be formed later.

Subsequently, an interlayer insulating layer 270 is formed on the entire surface of the substrate 200. The interlayer insulating layer 270 and the gate insulating layer 250 are partially etched to expose the source and drain regions 220c and 220d of the semiconductor layer 220a. A material for source and drain electrodes is deposited and patterned to form source and drain electrodes 271 and 272. By this process, a TFT is completed.

As described above, the MIC and MILC processes are performed such that no MILC front is formed in the channel region 220e of the semiconductor layer 220a. As a result, the mobility of charges increases, thus improving the electrical characteristics of an OLED display device.

The TFT according to the embodiment of the present invention as described above is not limited to an OLED display device, which will now be described, but may be applied to other display devices, such as an LCD.

Figure 2G:
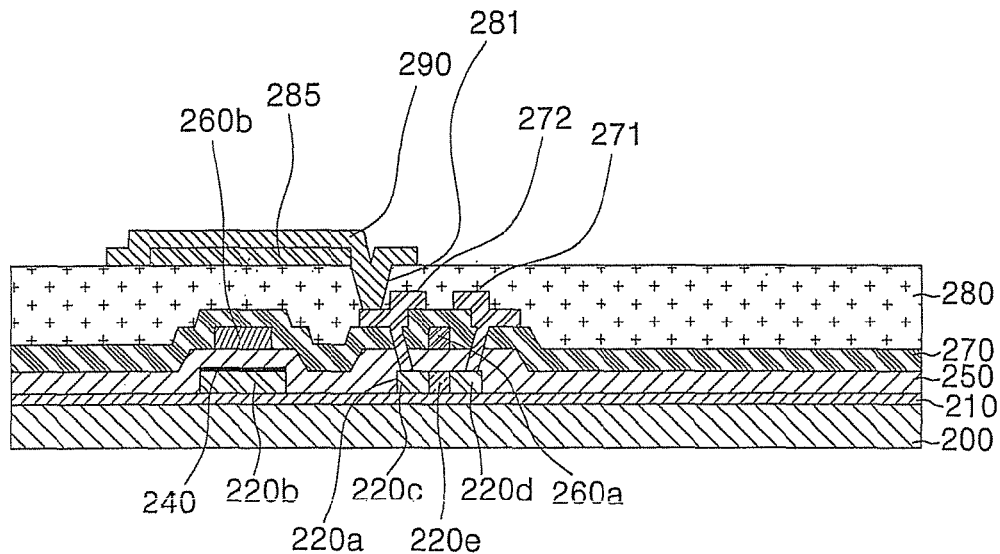

Referring to FIG. 2G, a planarization layer 280 is formed on the entire surface of the substrate 200. The planarization layer 280 may be an organic layer, an inorganic layer, or a combination thereof. The inorganic layer may be formed of spin on glass (SOG), and the organic layer may be formed of acryl resin, polyimide resin, or benzocyclobutene (BCB). Also, the planarization layer 280 may include a via hole 281 that exposes one of the source and drain electrodes 271 and 272.

A first electrode 290 including a reflective layer 285 is formed on the planarization layer 280. The first electrode 290 is in contact with the exposed one of the source and drain electrodes 271 and 272 at a bottom surface of the via hole 281 and extends onto the planarization layer 280. The first electrode 290 may be formed of indium tin oxide (ITO) or indium zinc oxide (IZO).

Figure 2H:
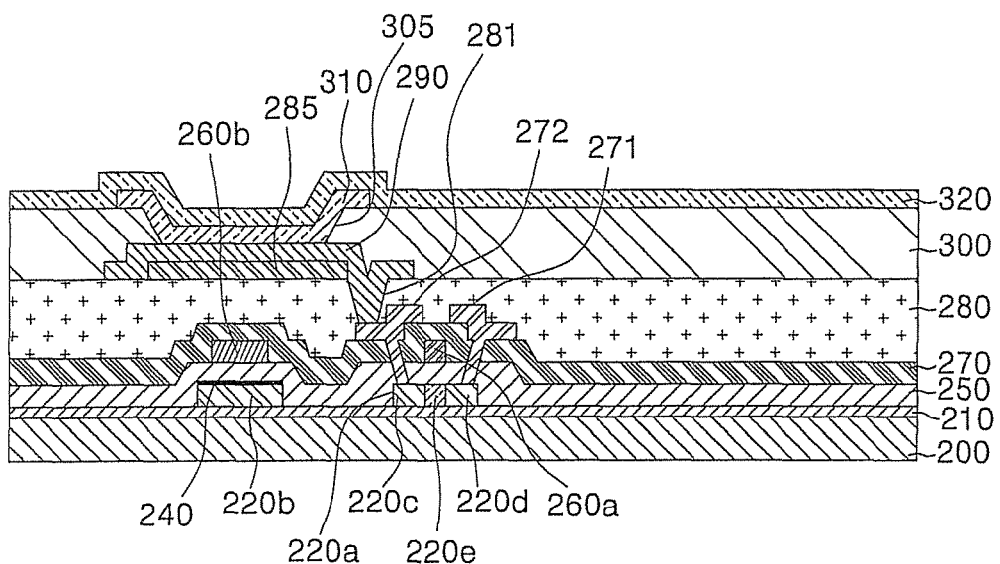

Referring to FIG. 2H, a pixel defining layer 300 is formed on the entire surface of the substrate 200 including the first electrode 290. The pixel defining layer 300 may be formed to a sufficient thickness so as to fill the via hole 281 in which the first electrode 290 is formed. The pixel defining layer 300 may be an organic layer or an inorganic layer. Preferably, the pixel defining layer 300 may be an organic layer. For example, the pixel defining layer 300 may be formed of one selected from the group consisting of BCB, acryl polymer, and polyimide. Since the pixel defining layer 300 has high flowability, the pixel defining layer 300 may be flattened on the entire surface of the substrate 200. The pixel defining layer 300 may be etched, thereby forming an opening 305 to expose the first electrode 290.

Thereafter, an organic layer 310 is formed on the first electrode 290 exposed by the opening 305. The organic layer 310 includes at least an emission layer and may include one of a hole injection layer, a hole transport layer, an electron transport layer, and an electron injection layer.

The organic layer 310 may be an RGB emission layer to form a full-color OLED display device. Alternatively, the organic layer 310 may be an emission layer formed of an organic material for forming a white OLED display device or an emission layer obtained by stacking R, G, and B emission layers to form a white OLED display device.

Thereafter, a second electrode 320 is formed on the entire surface of the substrate 200, thereby completing an OLED display device according to the embodiment of the present invention. Here, the second electrode 320 is a transmissive electrode that is formed of a transparent material having a low work function, for example, one selected from the group consisting of Mg, Ag, Al, Ca, and an alloy thereof.

As described above, MIC and MILC processes are performed such that no MILC front is formed in the channel region 220e of the semiconductor layer 220a. As a result, the mobility of charges increases, so that the OLED display device can have improved electrical characteristics.

Figure 3:
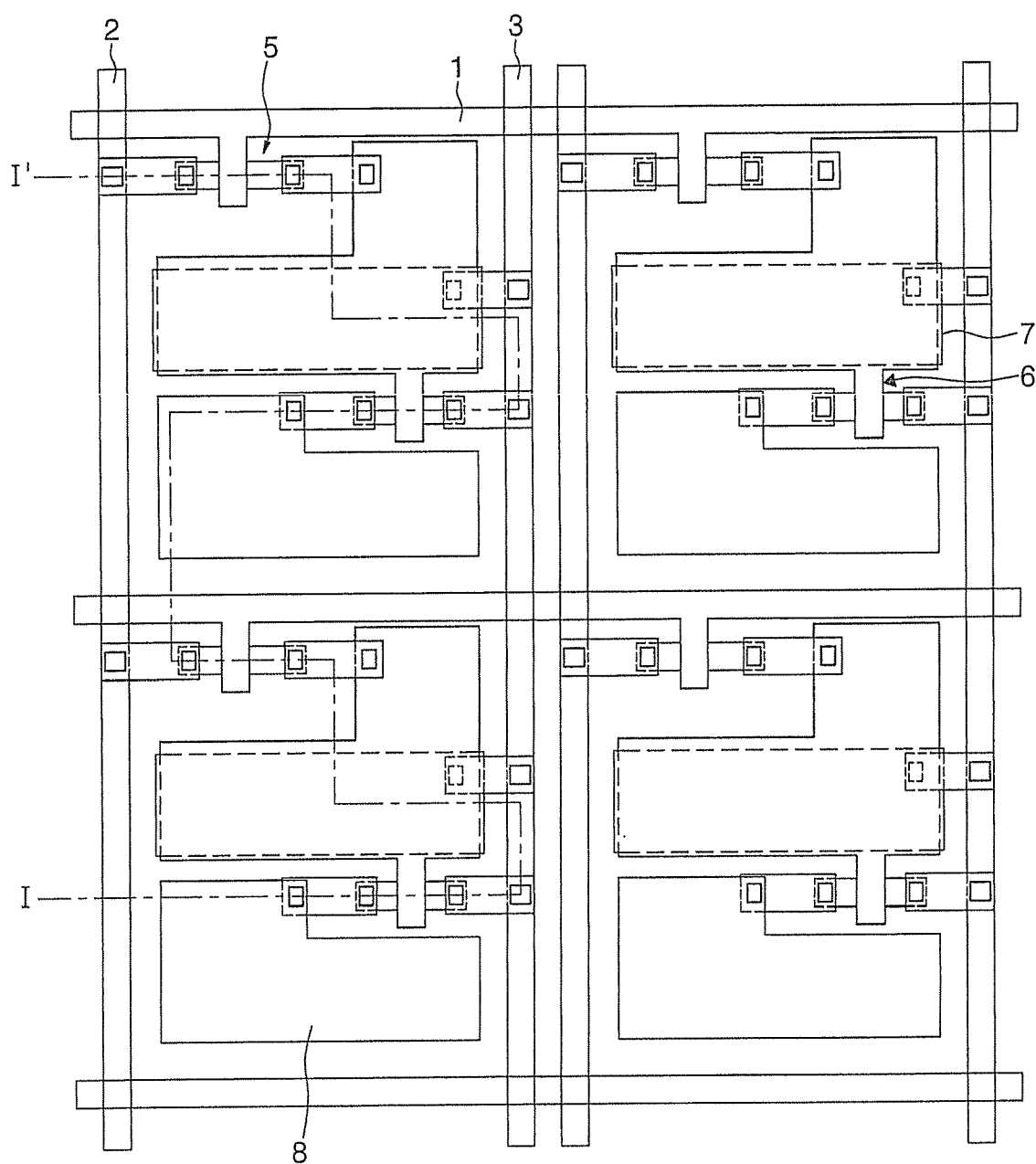
FIG. 3 is a plan view of an OLED display device according to another exemplary embodiment of the present invention.

FIG. 3 is a plan view of an OLED display device according to another exemplary embodiment of the present invention.

Referring to FIG. 3, a scan line 1 is arranged in a perpendicular direction to a data line 2, and the data line 2 is electrically insulated from the scan line 1 and intersects the scan line 1. A common power supply line 3 is electrically insulated from the scan line 1 and intersects the scan line 1. Also, the common power supply line 3 is arranged in a parallel direction to the data line 2. A plurality of unit pixels, for example, red (R), green (G), and blue (B) unit pixels are defined by the scan line 1, the data line 2, and the common power supply line 3.

Thus, in each unit pixel, a capacitor 7 accumulates a charge corresponding to a data signal applied to the data line 2 in response to a signal applied to the scan line 1, for example, a difference between a data voltage and a voltage applied to the common power supply line 3. Also, a driving TFT 6 receives a signal corresponding to the charge accumulated in the capacitor 7 through a switching TFT 5. Thereafter, the driving TFT 6 receives the data signal and transmits an electric signal to an organic light emitting diode 8 to emit light. Here, the organic light emitting diode 8 includes a pixel electrode, an upper electrode, and an organic emission layer disposed between the pixel electrode and the upper electrode.

FIGS. 4A through 4F are cross-sectional views taken along line I-I' of FIG. 3.

Figure 4A:
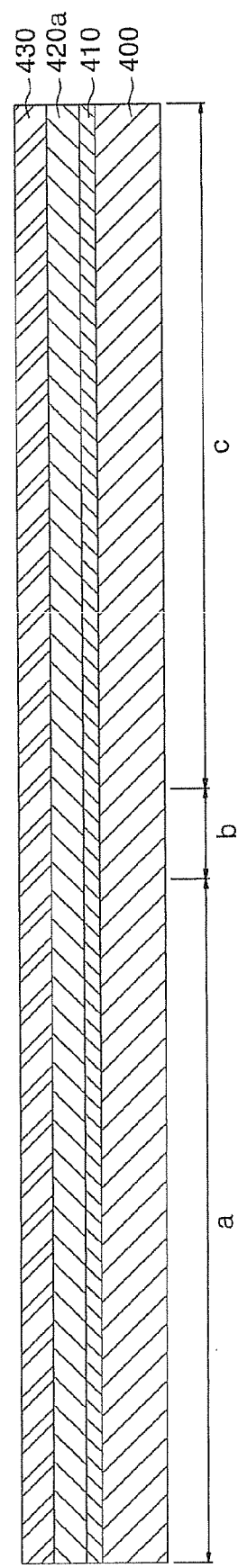
FIGS. 4A through 4F are cross-sectional views taken along line I-I' of FIG. 3.

Referring to FIG. 4A, a substrate 400, for example, a plastic substrate, a conductive substrate, or a transparent glass substrate, is provided. A first unit pixel region "a", a second unit pixel region "c", and a wiring region "b" located between the first unit pixel region and the second unit pixel region are defined in the substrate 400.

Thereafter, a buffer layer 410 is formed on the substrate 400 in order to protect the substrate 400 and a device that will be formed on the substrate 400. The buffer layer 410 may be a silicon oxide layer, a silicon nitride layer, or a combination thereof.

An a-Si layer 420a is formed on the entire surface of the substrate 400. The a-Si layer 420a may be formed using a PVD apparatus or a CVD apparatus. The PVD apparatus may be, for example, a sputtering apparatus. The CVD apparatus may be, for example, a PECVD apparatus or an LPCVD apparatus.

Thereafter, an insulating layer 430 is formed on the entire surface of the substrate 400. The insulating layer 430 may be a silicon oxide layer, a silicon nitride layer, or a combination thereof.

Figure 4B:
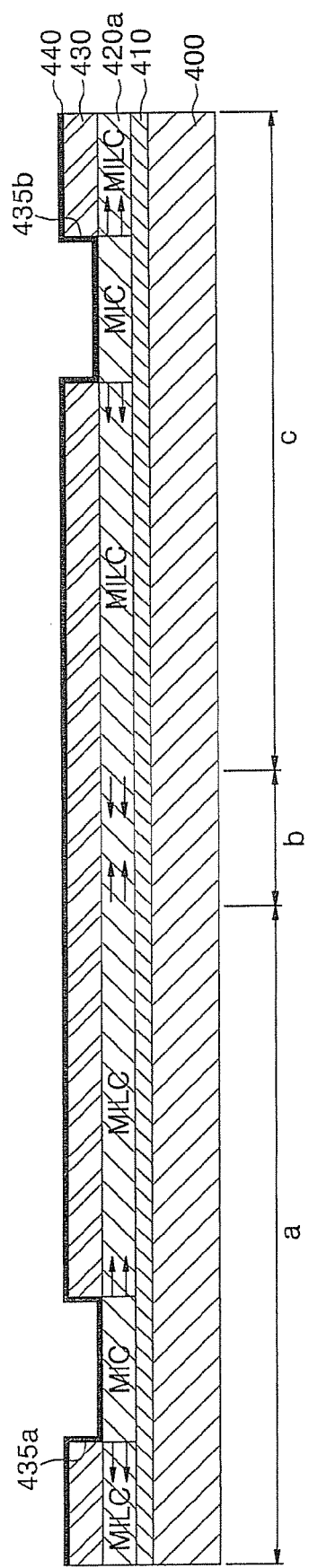

Referring to FIG. 4B, portions of the insulating layer 430 are etched, thereby forming openings 435a and 435b to expose regions of the a-Si layer 420a where a first capacitor electrode for a capacitor will be formed later.

The openings 435a and 435b are formed by etching the portions of the insulating layer 430, which are formed apart from each other symmetrically with respect to the wiring region "b", and expose the regions of the a-Si layer 420a. Thus, an MILC front may be formed in the wiring region "b" in subsequent MIC/MILC processes.

Subsequently, a crystallization inducing metal layer 440 is formed on the entire surface of the substrate 400. The crystallization inducing metal layer 440 may be formed of one selected from the group consisting of Ni, Pd, Ti, Ag, Au, Al, Sn, Sb, Cu, Co, Mo, Tr, Ru, Rh, Cd, and Pt. Preferably, the crystallization inducing metal layer 440 may be formed of Ni.

The crystallization inducing metal layer 440 may be formed using one selected from the group consisting of a sputtering apparatus, a heating evaporation apparatus, an ion implantation apparatus, and a CVD apparatus. Preferably, the crystallization inducing metal layer 440 may be formed using a sputtering apparatus.

The crystallization inducing metal layer 440 may be deposited to a thickness of 0.1 to 10000 Å, preferably, 10 to 200 Å. In this case, the crystallization inducing metal layer 440 is also deposited in the openings 435a and 435b formed in the insulating layer 430.

Subsequently, the substrate 400 is annealed to crystallize the a-Si layer 420a. Regions of the a-Si layer 420a that contact the crystallization inducing metal layer 440 (i.e., regions where the first capacitor electrode will be formed later) may be crystallized by an MIC process, while the remaining region of the a-Si layer 420a may be crystallized by an MILC process.

Specifically, the regions of the a-Si layer 420a exposed by the openings 435a and 435b of the insulating layer 430 (i.e., regions where the first capacitor electrode will be formed later) are crystallized by an MIC process. Also, MIC crystallinities formed during the MIC process diffuse into the remaining region of the a-Si layer 420a so that the remaining region of the a-Si layer 420a is crystallized by an MILC process. Since the regions on which the MIC process is performed are wide, a large amount of crystallization inducing metal is used for the MIC process. Thus, the region where the MILC process is performed is also widened so that even each unit pixel region may be crystallized by the MILC process.

Thus, MIC and MILC processes are performed through the openings 435a and 435b of the first and second unit pixel regions "a" and "c". In this case, MILC crystallinity of the first unit pixel region "a" comes across MILC crystallinity of the second unit pixel region "c" in the wiring region "b" where a metal wiring will be formed later, thus generating an MILC front.

Thus, a uniform MILC crystallized poly-Si region without an MILC front can be formed in each unit pixel, and a semiconductor layer can be patterned and used in each unit pixel without any limitation.

In another embodiment of the present invention, a region where a first electrode for the capacitor will be formed using the MIC process disposed in the center of each unit pixel performing the MIC and MILC processes, is described. However, an aspect of the present invention is not limited thereto and the regions where the first capacitor electrode will be formed using the MIC process may be any location that is symmetrical with respect to the wiring region "b", so that the MILC front can be formed in the wiring region "b".

As is well known, the MIC process includes crystallizing the a-Si layer 420a with metal or metal silicide, for example, nickel silicide. The MIC process may be performed at a low temperature of about 100 to 300° C.

The metal silicide used during the MIC process may be obtained by annealing silicon and one selected from the group consisting of Ni, Pd, Ti, Ag, Au, Al, Sn, Sb, Cu, Co, Mo, Tr, Ru, Rh, Cd, and Pt.

In an aspect of the present invention, the MIC and MILC processes are performed at a temperature of 400 to 700° C., preferably, 500 to 600° C., for several minutes to several tens of minutes so that crystallinities diffuse into each unit pixel.

Figure 4C:
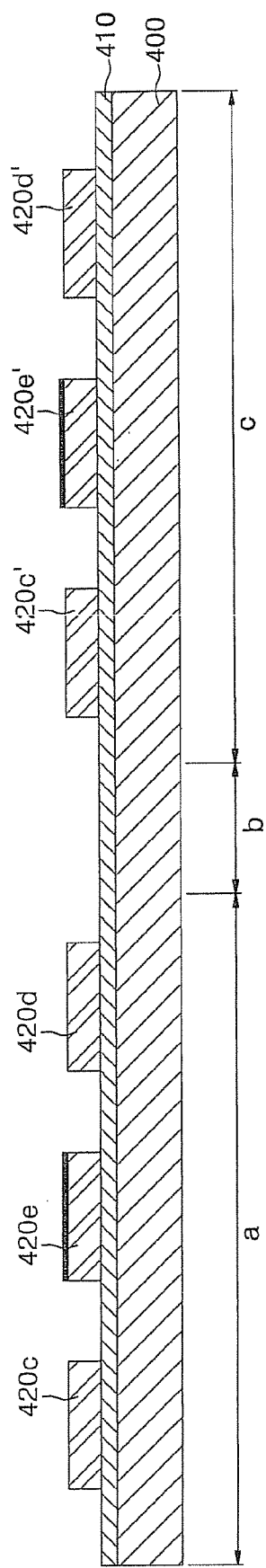

Referring to FIG. 4C, the insulating layer 430 and the crystallization inducing metal layer 440 are removed. The crystallization inducing metal layer 440 is not removed from portions of the poly-Si layer exposed by the opening 435a and 435b.

Thereafter, the crystallized poly-Si layer is patterned. Thus, semiconductor layers 420c and 420d and a first capacitor electrode 420e for a capacitor are formed in the first unit pixel region "a", while semiconductor layers 420c' and 420d' and a first capacitor electrode 420e' for a capacitor are formed in the second unit pixel region "c".

The first capacitor electrodes 420e and 420e' are formed using metal silicide regions that are crystallized in the previous MIC process. Since a capacitor having characteristics similar to a metal has better characteristics, metal silicide is not removed and used to form the first capacitor electrodes 420e and 420e'.

Also, the semiconductor layers 420c, 420d, 420c', and 420d' correspond to regions that are crystallized in the previous MILC process. The semiconductor layers 420c, 420d, 420c', and 420d' may be formed such that a lengthwise direction of a channel region of each of the semiconductor layers 420c, 420d, 420c', and 420d' is parallel to a crystallization direction of the MILC process. As a result, a channel region without an MILC front can be formed, enhancing the electrical characteristics of the device without lowering the mobility of charges.

Figure 4D:
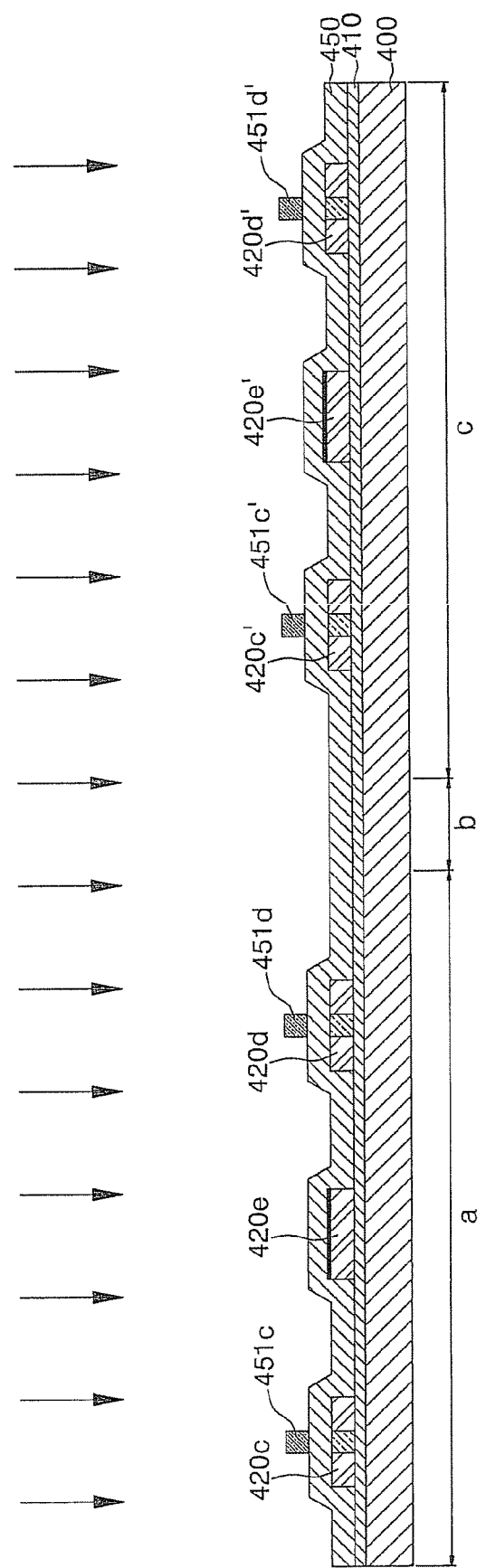

Referring to FIG. 4D, a gate insulating layer 450 is formed on the entire surface of the substrate 400. The gate insulating layer 450 may be a silicon oxide layer, a silicon nitride layer, or a double layer thereof. The gate insulating layer 450 is formed between the first capacitor electrodes 420e and 420e' and second capacitor electrodes, which will be formed later. Thus, the capacitance of the capacitor may be controlled by adjusting the thickness of the gate insulating layer 450. Since the capacitance of the capacitor is inversely proportional to the thickness of the gate insulating layer 450, the gate insulating layer 450 is formed as thin as possible.

Next, a photoresist is coated on the substrate 400 using, for example, a spin coating process, and photoresist patterns 451c, 451d, 451c', and 451d' are formed on portions of the semiconductor layers 420c, 420d, 420c', and 420d' using exposure and developing processes. The photoresist patterns 451c, 451d, 451c', and 451d' may be formed in the center of the semiconductor layers 420c, 420d, 420c', and 420d', respectively. This is because regions on which the photoresist patterns 451c, 451d, 451c', and 451d' are formed will be defined later as channel regions of the semiconductor layers 420c, 420d, 420c', and 420d', respectively.

Thereafter, an ion implantation process is performed using the photoresist patterns 451c, 451d, 451c', and 451d' as ion implantation masks on the entire surface of the substrate 400 having the photoresist patterns 451c, 451d, 451c', and 451d'. Thus, source and drain regions and a channel region are defined in each of the semiconductor layers 420c, 420d, 420c', and 420d'. Each of the semiconductor layers 420c, 420d, 420c', and 420d' is divided into the source and drain regions and the channel region because an impurity doped region is defined as the source and drain regions and an impurity undoped region is defined as the channel region.

Also, during the ion implantation process, impurity ions are also implanted into the first capacitor electrodes 420e and 420e'. As an electrode of a capacitor becomes more similar in electrical characteristics to a conductor, the characteristics of the capacitor become better. Therefore, by implanting impurity ions into the first capacitor electrodes 420e and 420e' formed of silicon, the first capacitor electrodes 420e and 420e' may be made similar to a conductor.

Figure 4E:
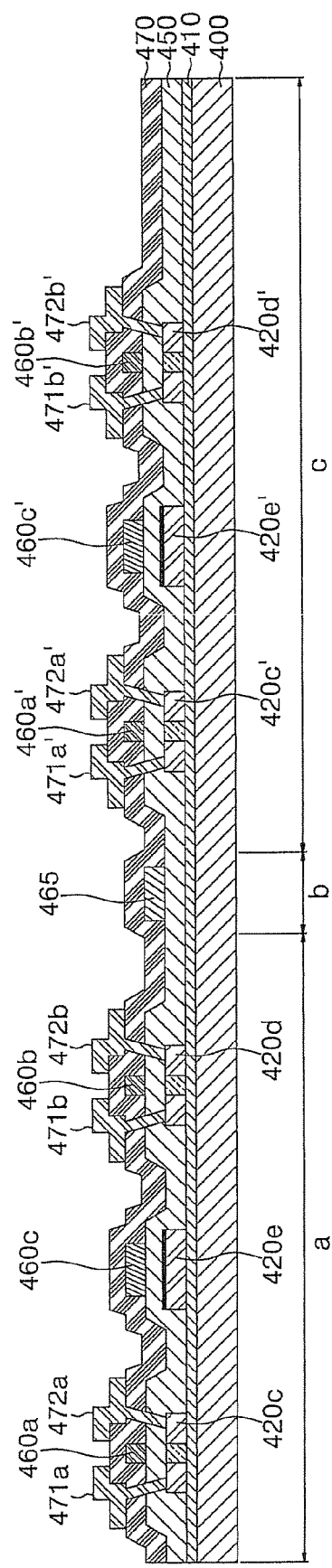

Referring to FIG. 4E, after the ion implantation process is finished, the photoresist patterns 451c, 451d, 451c', and 451d' are removed. A conductive material for forming both gate electrodes and second capacitor electrodes is deposited on the entire surface of the substrate 400 and patterned to correspond to portions of the semiconductor layer 420c, 420d, 420c', and 420d' and the first capacitor electrodes 420e and 420e'. Thus, gate electrodes 460a, 460b, 460a', and 460b' and second capacitor electrodes 460c and 460c' are formed, thereby completing capacitors. The second capacitor electrodes 460c and 460c' may be formed of the same material as the gate electrodes 460a, 460b, 460a', and 460b' or of the same material as source and drain electrodes that will be formed later.

Subsequently, an interlayer insulating layer 470 is formed on the entire surface of the substrate 400. The interlayer insulating layer 470 and the gate insulating layer 450 are partially etched to expose the source and drain regions of the semiconductor layers 420c, 420d, 420c', and 420d'. A material for source and drain electrodes is deposited and patterned to form source and drain electrodes 471a, 472a, 471b, 472b, 471a', 472a', 471b', and 472b'. In this process, TFTs and capacitors are completed.

As described above, the MIC and MILC processes are performed such that no MILC front is formed in the channel regions of the semiconductor layers 420c, 420d, 420c', and 420d'. As a result, the mobility of charges increases, thus improving the electrical characteristics of an OLED display device.

The TFT according to another embodiment of the present invention as described above is not limited to an OLED display device, which will now be described, but may be applied to other display devices, such as an LCD.

Figure 4F:
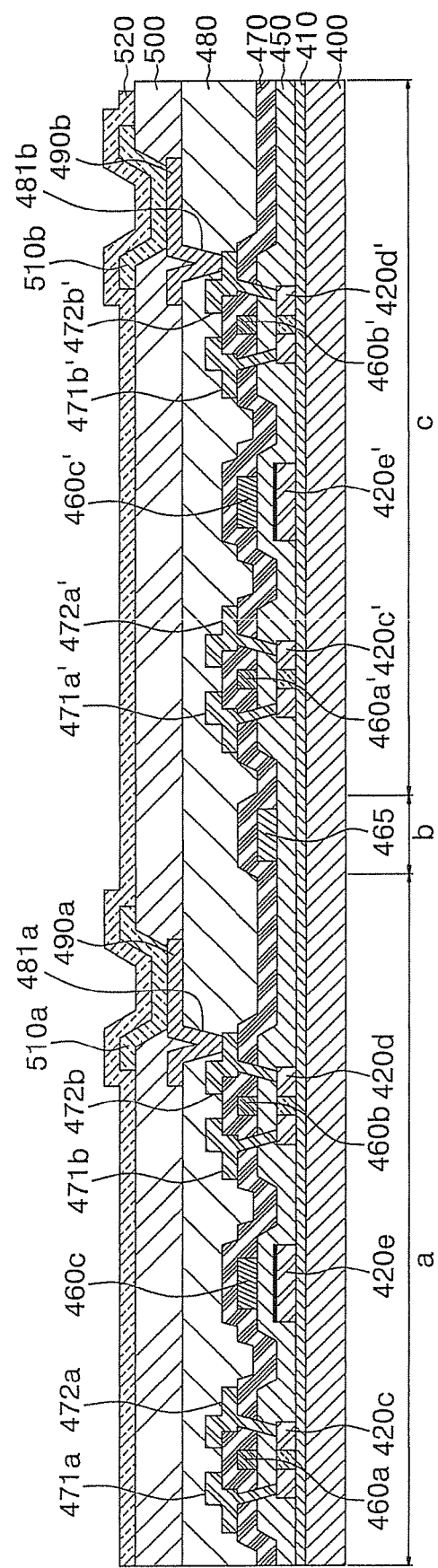

Referring to FIG. 4F, a planarization layer 480 is formed on the entire surface of the substrate 400. The planarization layer 480 may be an organic layer, an inorganic layer, or a combination thereof. The inorganic layer may be formed of SOG, and the organic layer may be formed of acryl resin, polyimide resin, or BCB. Also, the planarization layer 480 may include via holes 481a and 481b, each of which exposes one of the source and drain electrodes 471a, 472a, 471b, 472b, 471a', 472a', 471b', and 472b'.

First electrodes 490a and 490b are formed on the planarization layer 480. The first electrodes 490a and 490b are in contact with the exposed ones of the source and drain electrodes 471a, 472a, 471b, 472b, 471a', 472a', 471b', and 472b' at bottom surfaces of the via holes 481a and 481b and extend onto the planarization layer 480. The first electrodes 490a and 490b may be formed of ITO or IZO.

Thereafter, a pixel defining layer 500 is formed on the entire surface of the substrate 400 including the first electrodes 490a and 490b. The pixel defining layer 500 may be formed of a sufficient thickness so as to fill the via holes 481a and 481b in which the first electrodes 490a and 490b are formed. The pixel defining layer 500 may be an organic layer or an inorganic layer. Preferably, the pixel defining layer 500 may be an organic layer. For example, the pixel defining layer 500 may be formed of one selected from the group consisting of BCB, acryl polymer, and polyimide. Since the pixel defining layer 500 has high flowability, the pixel defining layer 500 may be flattened on the entire surface of the substrate 400. The pixel defining layer 500 may be etched, thereby forming openings to expose the first electrodes 490a and 490b.

Thereafter, organic layers 510a and 510b are formed on the first electrodes 490a and 490b exposed by the openings. Each of the organic layers 510a and 510b includes at least an emission layer and may include one of a hole injection layer, a hole transport layer, an electron transport layer, and an electron injection layer.

Each of the organic layers 510a and 510b may be an RGB emission layer to realize a full-color OLED display device. Alternatively, each of the organic layers 510a and 510b may be an emission layer formed of an organic material for forming a white OLED display device or an emission layer obtained by stacking R, G, and B emission layers to form a white OLED display device.

Thereafter, a second electrode 520 is formed on the entire surface of the substrate 500, thereby completing an OLED display device according to another embodiment of the present invention. Here, the second electrode 520 is a transmissive electrode that is formed of a transparent material having a low work function, for example, one selected from the group consisting of Mg, Ag, Al, Ca, and an alloy thereof.

As described above, MIC and MILC processes are performed such that no MILC front is formed in the channel region of the semiconductor layer. As a result, the mobility of charges increases, improving the electrical characteristics of the OLED display device.

Further, the regions that are crystallized by the MIC process are formed apart from each other symmetrically with respect to the wiring region 'b'. Therefore, no MILC front is formed in each of the first and second unit pixel regions 'a' and 'c' and thus, a semiconductor layer may be formed in a region without any limitation.

In conclusion, an OLED and method of manufacturing the same according to embodiments of the present invention can improve the electrical characteristics of a TFT, increasing the luminous efficiency of the OLED.

Although few aspects of the present invention have been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting diode display device (OLED display device) comprising:
   a substrate;
   a semiconductor layer disposed on the substrate, and comprising source and drain regions and a channel region that are formed using metal induced lateral crystallization (MILC);
   a gate insulating layer electrically insulating the semiconductor layer;
   a gate electrode disposed on the gate insulating layer;
   an interlayer insulating layer electrically insulating the gate electrode;
   a thin film transistor (TFT) comprising the semiconductor layer and source and drain electrodes that are electrically connected to the source and drain regions of the semiconductor layer;
   a first capacitor electrode disposed on a region of the substrate to be spaced apart from the TFT, and formed using a metal induced crystallization (MIC), the gate insulating layer electrically insulating the first capacitor electrode;
   a second capacitor electrode disposed on the gate insulating layer;
   a planarization layer disposed on the TFT and the capacitor;
   a first electrode disposed on the planarization layer;
   a pixel defining layer disposed on the first electrode;
   an organic layer disposed on the first electrode and the pixel defining layer, and comprising an emission layer; and
   a second electrode disposed on the organic layer,
   wherein the first capacitor electrode further comprises a metal layer comprising a metal silicide.

2. The OLED display device according to claim 1, wherein a lengthwise direction of the channel region of the semiconductor layer is parallel to a crystallization direction of the MILC.

3. The OLED display device according to claim 1, wherein the second capacitor electrode is formed of the same material as one of the gate electrode and the source and drain electrodes.

4. The OLED display device according to claim 1, wherein the semiconductor layer does not comprise a metal silicide.

5. The OLED device according to claim 1, wherein an MILC front is not formed in the channel region.

6. An organic light emitting diode display device (OLED display device) comprising:
   a substrate in which a first unit pixel region, a second unit pixel region, and a wiring region between the first unit pixel region and the second unit pixel region are defined;

semiconductor layers disposed on the first unit pixel region and the second unit pixel region of the substrate, each semiconductor layer comprising source and drain regions and a channel region that are obtained using metal induced lateral crystallization (MILC);

a gate insulating layer electrically insulating the semiconductor layers;

gate electrodes disposed on the gate insulating layer;

an interlayer insulating layer electrically insulating the gate electrodes;

TFTs, each TFT comprising one of the semiconductor layers and source and drain electrodes that are electrically connected to the source and drain regions of the semiconductor layer;

first capacitor electrodes symmetrically disposed with respect to the wiring region in respective unit pixels of the substrate, and disposed on the first and second unit pixel regions, and formed using metal induced crystallization (MIC);

the gate insulating layer electrically insulating the first capacitor electrodes;

second capacitor electrodes disposed on the gate insulating layer;

a planarization layer disposed on the TFTs and the capacitors;

a first electrode disposed on the planarization layer;

a pixel defining layer disposed on the first electrode;

an organic layer disposed on the first electrode and the pixel defining layer, the organic layer comprising an emission layer; and a second electrode disposed on the organic layer, wherein each of the first capacitor electrodes further comprises a metal layer comprising a metal silicide.

7. The OLED display device according to claim 6, wherein a lengthwise direction of the channel region of each of the semiconductor layers is parallel to a crystallization direction of the MILC.

8. The OLED display device according to claim 6, wherein the second capacitor electrodes are formed of a same material as at least one of the gate electrodes, and the source and drain electrodes.

9. The OLED display device according to claim 6, wherein the semiconductor layer does not comprise a metal silicide.

10. The OLED device according to claim 6, wherein MILC fronts are not formed in the channel regions.

* * * * *